United States Patent
Liu et al.

(10) Patent No.: US 11,463,025 B2
(45) Date of Patent: Oct. 4, 2022

(54) PIEZOELECTRIC ELECTROMAGNETIC COMPOSITE ENERGY HARVESTER BASED ON PARALLEL MECHANISM

(71) Applicant: TIANGONG UNIVERSITY, Tianjin (CN)

(72) Inventors: Pengfei Liu, Tianjin (CN); Minghui Yao, Tianjin (CN); Ii Ma, Beijing (CN)

(73) Assignee: TIANGONG UNIVERSITY, Tianjin (CN)

( * ) Notice: Subject to any disclaimer, the term of this patent is extended or adjusted under 35 U.S.C. 154(b) by 315 days.

(21) Appl. No.: 16/642,325

(22) PCT Filed: Feb. 7, 2018

(86) PCT No.: PCT/CN2018/075621
§ 371 (c)(1),
(2) Date: Feb. 26, 2020

(87) PCT Pub. No.: WO2019/041758
PCT Pub. Date: Mar. 7, 2019

(65) Prior Publication Data
US 2020/0313576 A1     Oct. 1, 2020

(30) Foreign Application Priority Data
Aug. 28, 2017 (CN) .......................... 201710751036.7

(51) Int. Cl.
*H02N 2/18*     (2006.01)
*H01L 41/113*     (2006.01)
(Continued)

(52) U.S. Cl.
CPC ......... *H02N 2/186* (2013.01); *H01L 41/1136* (2013.01); *H01L 41/193* (2013.01); *H02K 35/02* (2013.01)

(58) Field of Classification Search
CPC ... H02N 2/186; H01L 41/1136; H01L 41/193; H02K 35/02
(Continued)

(56) References Cited

U.S. PATENT DOCUMENTS

2009/0224633 A1* 9/2009 Clingman .............. H02N 2/186
310/331

FOREIGN PATENT DOCUMENTS

| CN | 101741278 A | 6/2010 |
| CN | 103560640 A | 2/2014 |

(Continued)

*Primary Examiner* — Charles Reid, Jr.
(74) *Attorney, Agent, or Firm* — Leonid Kisselev

(57) ABSTRACT

The invention provides a piezoelectric electromagnetic combined energy harvester based on parallel mechanism. The harvester includes fixed bracket, three groups of motion branches and movable bracket. The movable bracket includes bottom platform, the bottom platform support frame and the bottom platform connector. The invention realizes multi-direction telescopic motion, and the magnetic flux of the coil is constantly changing, generating induced electromotive force. The vibration of piezoelectric beam causes the polarization of piezoelectric material and produces the output voltage. The invention uses parallel mechanism to introduce twelve piezoelectric beams, twelve permanent magnets and twenty-four coils in a small working space. The limited working space is fully utilized, and the combined working mode of piezoelectric energy collection technology and electromagnetic energy collection technology is adopted to make the overall power generation effect better, improve the power generation, and broaden the effective working bandwidth.

3 Claims, 8 Drawing Sheets

(51) Int. Cl.
*H01L 41/193* (2006.01)
*H02K 35/02* (2006.01)

(58) Field of Classification Search
USPC .......................................................... 310/339
See application file for complete search history.

(56) References Cited

FOREIGN PATENT DOCUMENTS

| | | | |
|---|---|---|---|
| CN | 105680720 A | 6/2016 |
| CN | 107598893 A | 1/2018 |
| WO | WO2008042603 A2 | 4/2008 |
| WO | WO2007061610 A1 | 5/2008 |

* cited by examiner

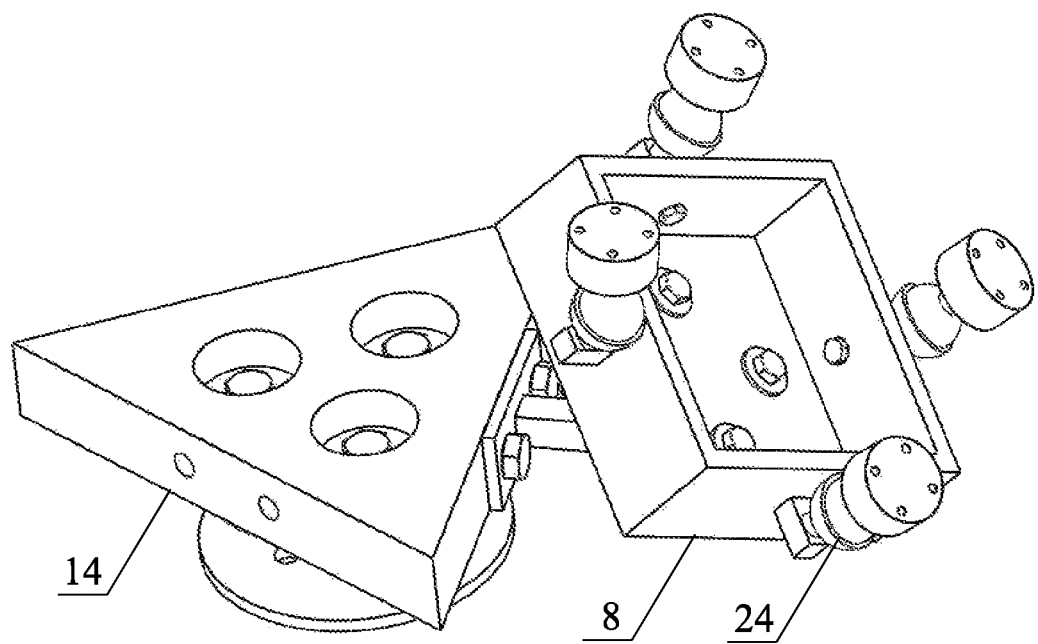
FIG.10.1
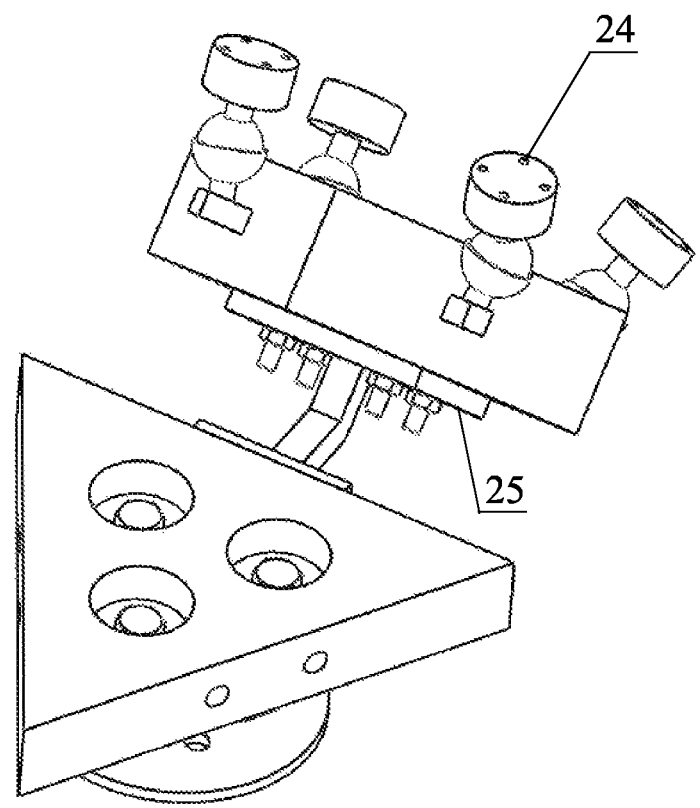
FIG.10.2

PIEZOELECTRIC ELECTROMAGNETIC COMPOSITE ENERGY HARVESTER BASED ON PARALLEL MECHANISM

CROSS REFERENCE TO RELATED APPLICATION

This application is a national stage application of International application number PCT/CN2018/075621, filed Feb. 7, 2018, titled "PIEZOELECTRIC ELECTROMAGNETIC COMPOSITE ENERGY HARVESTER BASED ON PARALLEL MECHANISM," which claims the priority benefit of Chinese Patent Application No. 201710751036.7, filed on Aug. 28, 2017, the content of which is hereby incorporated by reference in its entirety.

TECHNICAL FIELD

The invention relates to piezoelectric power generation and environment-friendly renewal-energy in general, and in particular to a piezoelectric electromagnetic combined energy harvester based on parallel mechanism.

BACKGROUND

With the progress of science and technology and people's increasing attention to the living environment, new energy harvester that uses energy acquisition technology to convert the ambient energy into electric energy, store it and supply the low-power devices has become a research hotspot. At present, commonly used energy collection methods are piezoelectric and electromagnetic. The combination of these two methods converts the vibration energy in natural environment into electric energy, which can not only improve the energy collection efficiency, but also save energy and protect the environment. Parallel mechanism is often used in the field of industrial robot, and has two or more degrees of freedom. The structure of the parallel mechanism is compact, which reduces the working space and lightens the motion branch. Parallel mechanism has many degrees of freedom which can realize stable high-speed movements in many directions. Therefore, the invention combines parallel mechanism, piezoelectric material vibration power generation and electromagnetic induction power generation, which can effectively collect vibration energy in multiple directions in the environment and improve the power generation capacity.

SUMMARY

In order to collect the vibration energy in the environment more efficiently and more thoroughly, the invention provides a piezoelectric electromagnetic combined energy harvester based on parallel mechanism. Twelve piezoelectric beams and twenty-four electromagnetic induction generators are introduced into a small compact working space where both low- and high-speed vibration can be realized in multiple directions, so that the mechanical energy of direct directions in the environment can be collected, and the system's power generation efficiency is effectively improved. The invention works on multiple degrees of freedom, realizes multi-direction vibration, collects the energy of vibration in each direction of the surrounding environment for more efficient electric power generation. The invention also combines piezoelectric material vibration power generation with electromagnetic induction power generation, which improves the power generation capacity.

In order to solve the above technical problems, the following technical plan is disclosed: a piezoelectric electromagnetic combined energy harvester based on parallel mechanism, the harvester comprising fixed bracket 1, three groups of motion branches and movable bracket. The fixed bracket 1 is composed of three fixed branches, the angles of the adjacent two fixed branches are all 120°, so that the branches of parallel mechanism are evenly distributed, and center of the fixed branch is provided with square holes to reduce weight. The central position of the fixed bracket 1 has six bolt holes. The fixed bracket 1 fixes with the external platform through bolt connection. Each group of motion branches has the same structure and includes fixed platform 2, four telescopic motion components and a motion platform 8. The motion platform includes bottom platform connector 25, bottom platform 14 and bottom platform support 9. Fixed platform 2 of the motion branch is connected with the fixed bracket 1 through bolts, and movable bracket is connected with the three groups of motion branches through the bottom platform connector 25.

Each telescopic motion component is composed of a Hooke universal joint 10, a telescopic rod component, a piezoelectric beam component and a ball hinge 24. The Hooke universal joint 10 and the fixed platform 2 are connected by a Hooke bracket clamp 11, the Hooke universal joint 10 is installed on the joint of telescopic rod component upper connector 17 by bolts, the telescopic rod component connects piezoelectric beam component by bolts, the piezoelectric beam component and ball hinge 24 are also connected by bolts. The telescopic rod component includes upper connector 17, a sleeve 6, a sleeve end cover 16, a motion guide rod 4, a motion rod spring 15, a permanent magnet 19, a magnet upper end cover 18, a magnet bottom end cover 20 and a coil 3. The upper connector 17 on the telescopic rod connects the sleeve 6 by bolts, the outer wall of the sleeve 6 is wrapped with the coil 3, the sleeve end cover 16 is circular and is installed on one end of the sleeve that is far away from the upper connector 17. The motion guide rod 4 is extended into the sleeve 6 through a center hole of sleeve end cover 16, and the telescopic movement can be made in sleeve 6. The top of the motion guide rod 4 fixes the permanent magnet 19 through the magnet upper end cover 18 and the magnet lower end cover 20; a motion rod spring 15 is installed between the magnet lower end cover 20 and sleeve 6; another motion rod spring 15 is installed between the magnet upper end cover 18 and the top of the sleeve 6 inner wall. The initial position of permanent magnet 19 is in the middle of sleeve 6. When the system is stimulated by external excitation, the motion guide rod 4 makes reciprocating, i.e., telescopic motion along the inner wall of the sleeve 6. The motion rod spring 15 provides support and cushion to the motion rod 4, and the outer wall of the sleeve 6 is wound with copper enameled coil 3. The permanent magnet 19 reciprocates with the motion guide rod 4 on the inner wall of sleeve 6, the magnetic flux inside the closed coil changes continuously, which generates the induced electromotive force.

The piezoelectric beam component is composed of two piezoelectric beam clamps 7 and a PVDF piezoelectric beam 5. The piezoelectric beam clamp 7 is composed of a fixed base 22, a fixed splint 21 and a movable splint 23. The fixed base 22 and the motion guide rod 4 are connected by bolts; the fixed base 22 and the fixed splint 21 are fixed by bolts; the movable splint 23 slides on the fixed base 22 through the slide groove of the fixed base 22, thus adjusting the distance between the fixed splint 21 and the movable splint 23. The PVDF piezoelectric beam 5 is clamped between the fixed splint 21 and the movable splint 23. The fixed splint 21, the movable splint 23 and the PVDF piezoelectric beam 5 are clamped and fixed by bolts. The piezoelectric beam includes a protective layer, a piezoelectric layer and a base layer; the protective layer is glued on the piezoelectric layer through conductive adhesive; the piezoelectric layer is glued on the base layer by conductive adhesive. When the system is excited by the external environment, the telescopic rod component makes reciprocating movement. Since the internal part of telescopic rod component has a motion rod spring 15 to provide cushion and support, the cushioning force (or impact force) is transferred to the PVDF piezoelectric beam 5 through the motion guide rod 4. Since the PVDF piezoelectric beam 5 has certain flexibility, it continuously bends, deforms, and recoveries, which leads to the polarization of piezoelectric material that in turn generates electricity. The ball hinge 24 is connected to the piezoelectric beam component through bolts, and is connected to the motion platform 8 through bolts. The movable support is composed of a bottom platform 14, a bottom platform support frame 9 and a bottom platform connector 25. The bottom platform 14 and motion platform 8 are connected by bolts through bottom platform connector 25. The bottom platform support frame 9 and the bottom platform 14 are connected by bolts. Vibration excitation from external environment is transferred to the system through bottom platform support frame 9 for energy collection.

The piezoelectric beam clamp 7 can clamp piezoelectric beams with different thickness.

The protective layer can be made from polyester; the piezoelectric layer can be made from polarized PVDF, which has the advantages includes efficient power generating capacity, ample flexibility and resistance to breakage; the base layer material can be one of carbon fiber, steel or aluminum alloy.

Compared with the existing technology, the invention is based on parallel mechanism, which can perform multi-direction vibration, and as a result can collect vibration mechanical energy from each and multiple directions in the environment simultaneously.

The invention uses a parallel mechanism that introduces twelve piezoelectric beams, twelve permanent magnets and twenty-four coils in a compact working space. The limited working space is fully utilized, and the combined working mode of piezoelectric energy collection technology and electromagnetic energy collection technology is adopted to improve the overall power generation outcome, enhance the power generation amount, and broaden the effective working bandwidth.

Still other embodiments of the present invention will become readily apparent to those skilled in the art from the following detailed description, wherein is described embodiments of the invention by way of illustrating the best mode contemplated for carrying out the invention. As will be realized, the invention is capable of other and different embodiments and its several details are capable of modifications in various obvious respects, all without departing from the spirit and the scope of the present invention. Accordingly, the drawings and detailed description are to be regarded as illustrative in nature and not as restrictive.

BRIEF DESCRIPTION OF THE DRAWINGS

The invention may best be understood by referring to the following description and accompanying drawings that are used to illustrate embodiments of the invention. The invention is illustrated by ways of example in the embodiments and it not limited in the figures of the accompanying drawings, in which like references indicates similar elements.

FIG. 10.1 is a schematic diagram of the connection between the movable bracket and the motion platform.

FIG. 10.2 is another schematic diagram of the connection between the movable bracket and the motion platform, according to one embodiment.

The numbers and corresponding names in the figure are: 1—fixed bracket, 2—fixed platform, 3—copper enameled coil, 4—motion guide rod, 5—piezoelectric beam, 6—sleeve, 7—piezoelectric beam clamp, 8—motion platform, 9—bottom platform support frame, 10—Hooke universal joint, 11—Hooke bracket clamp, 12—Hooke bracket spring, 13—outer cover of Hooke bracket, 14—bottom platform, 15—motion rod spring, 16—sleeve end cover, 17—telescopic rod component upper connector, 18—magnet upper end cover, 19—permanent magnet, 20—magnet bottom end cover, 21—fixed splint, 22—fixed base, 23—movable splint, 24—ball hinge, 25—bottom platform connector.

DETAILED DESCRIPTION OF THE PREFERRED EMBODIMENTS

The invention is further described in detail in combination with the Preferred embodiments.

Figure 1:
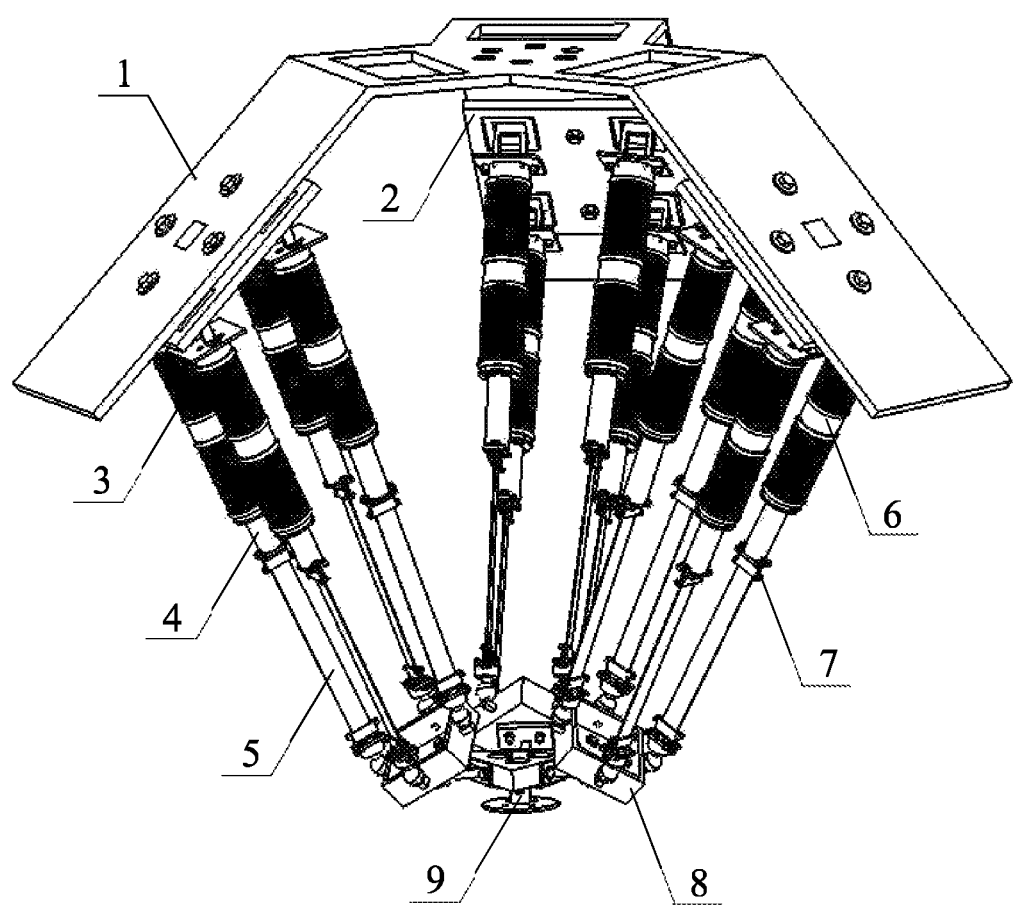
FIG. 1 is the overall structure diagram of a piezoelectric electromagnetic combined energy harvester based on parallel mechanism, according to one embodiment.
Figure 2:
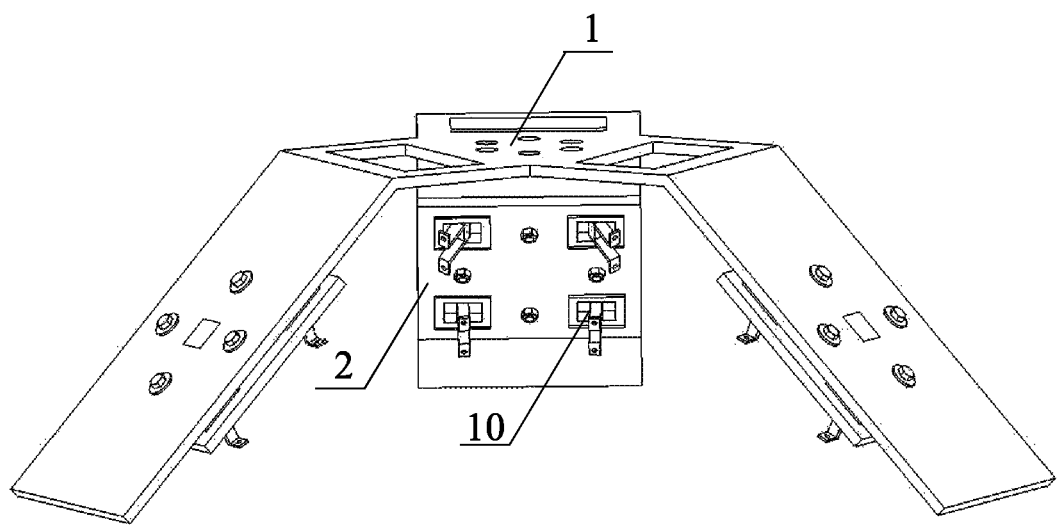
FIG. 2 is a structural diagram of the fixed bracket, according to one embodiment.
Figure 3:
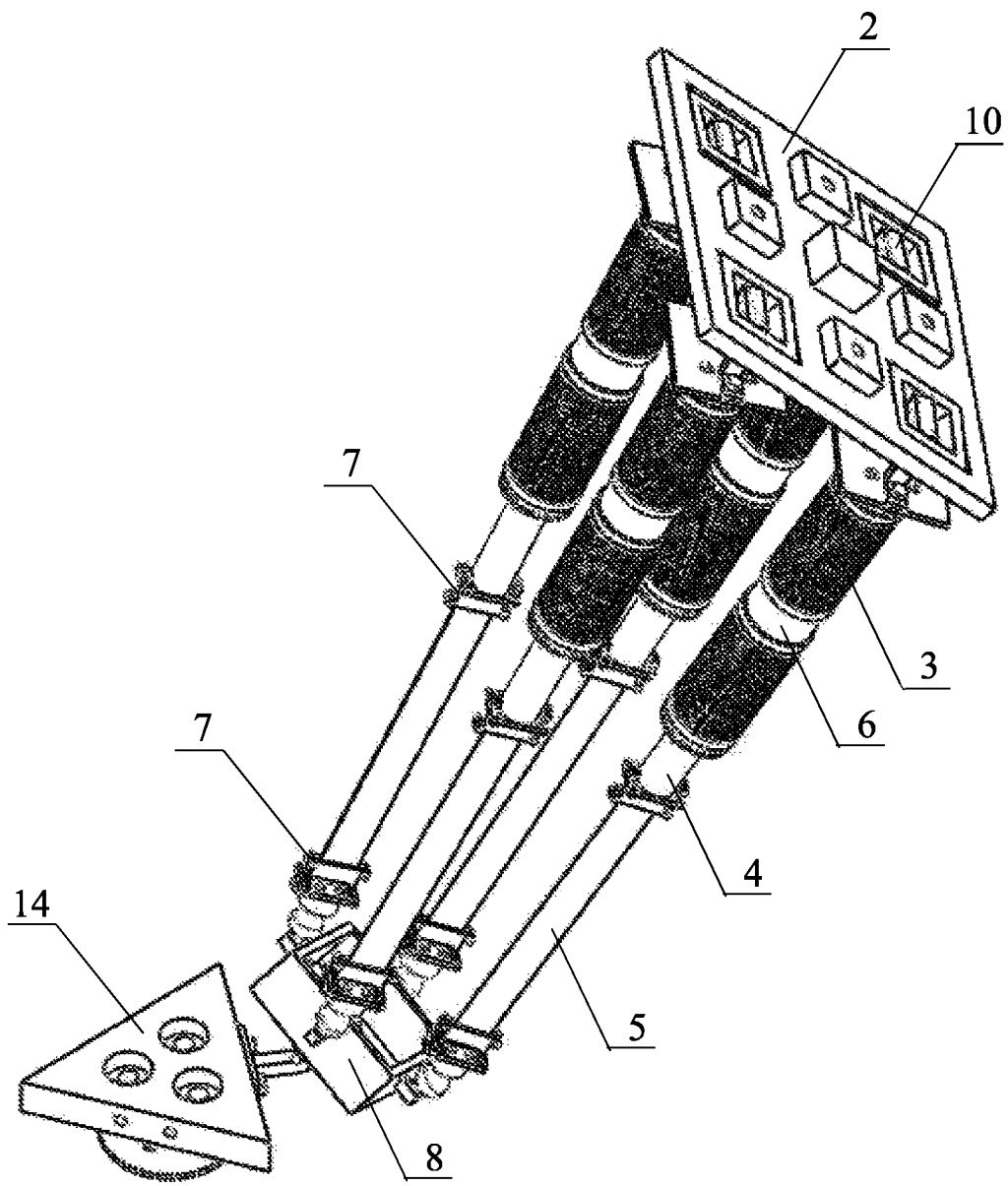
FIG. 3 is a structural diagram of the motion branch, according to one embodiment.
Figure 4:
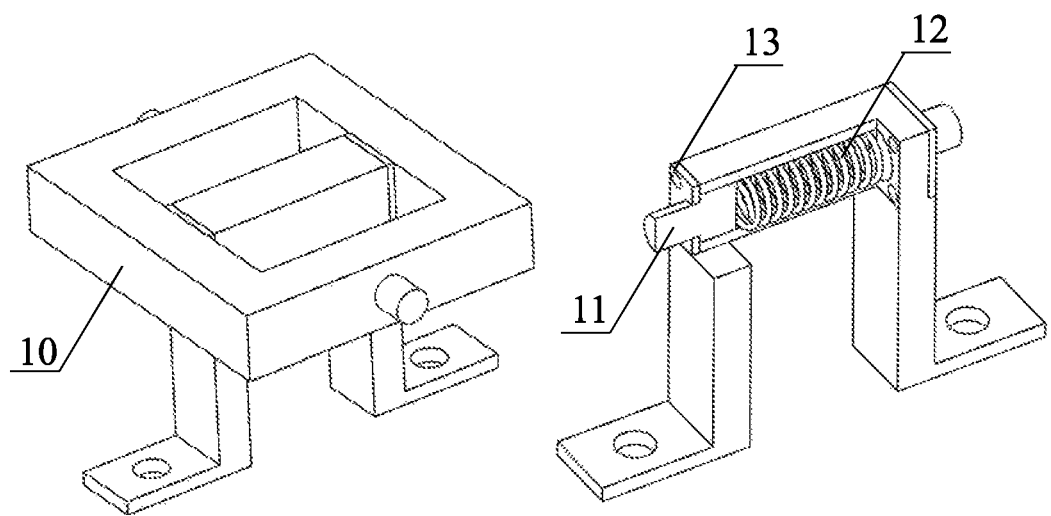
FIG. 4 is a structural diagram of the Hooke universal joint, according to one embodiment.
Figure 5:
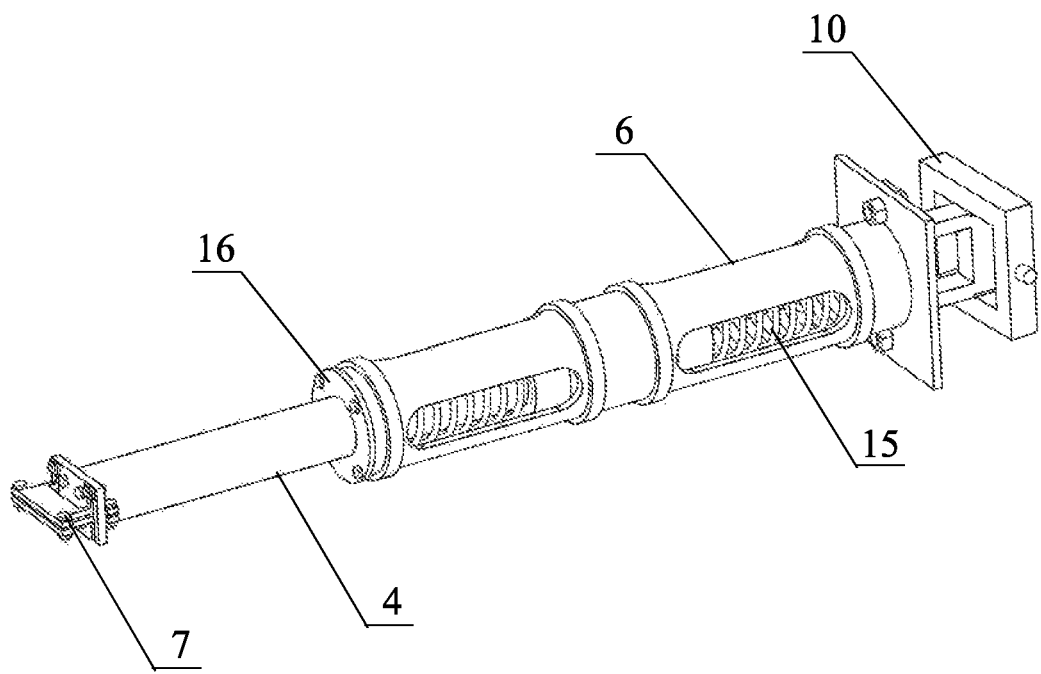
FIG. 5 is a forward structural diagram of the telescopic rod component, according to one embodiment.
Figure 6:
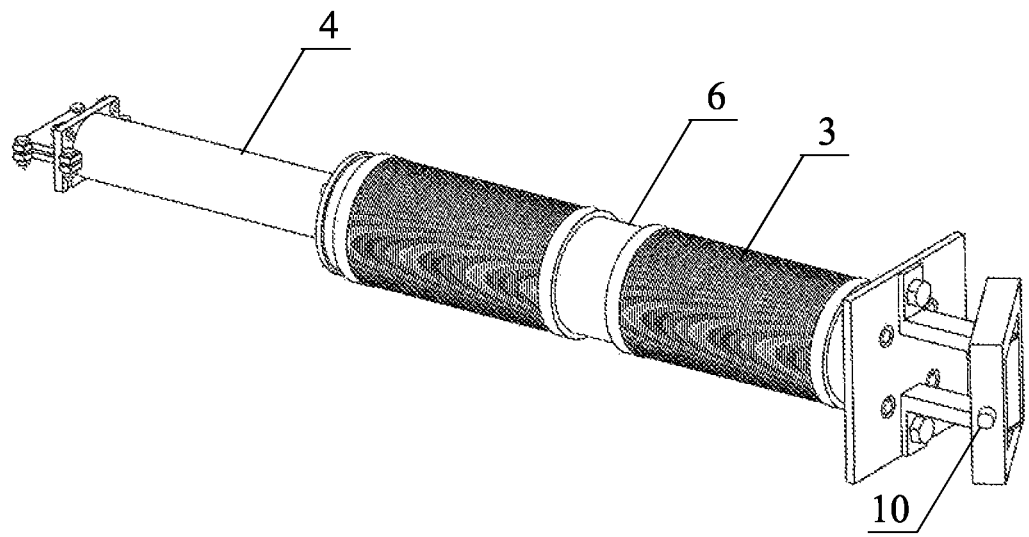
FIG. 6 is a backward structural diagram of the telescopic rod component, according to one embodiment.
Figure 7:
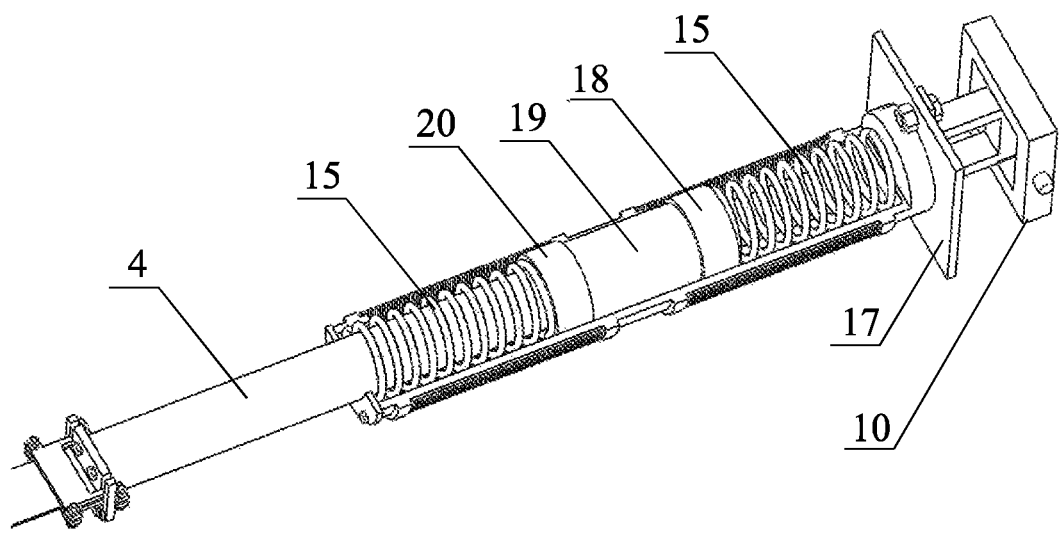
FIG. 7 is a half section view of the structure diagram of the telescopic rod component, according to one embodiment.
Figure 8:
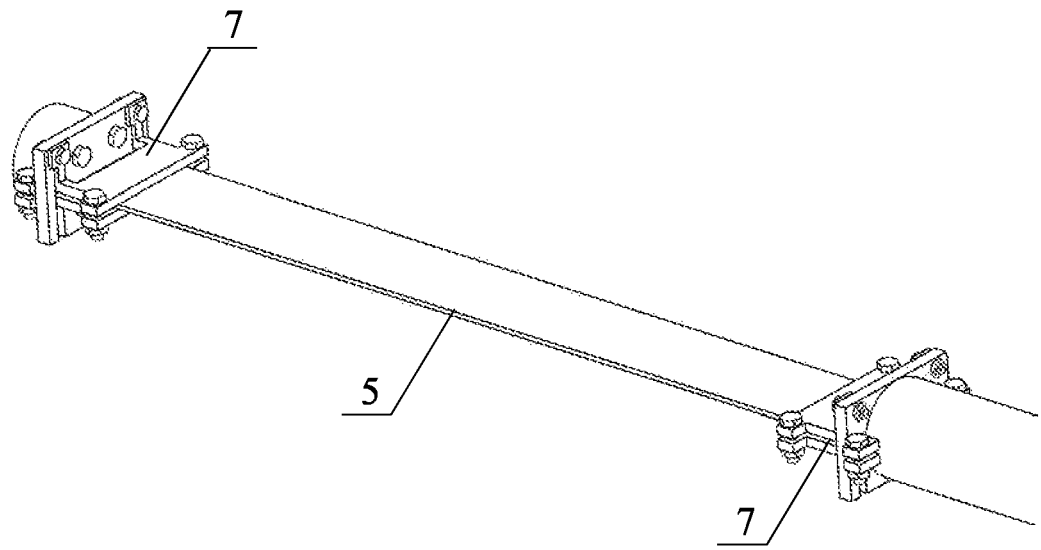
FIG. 8 is a structural diagram of the piezoelectric beam component, according to one embodiment.
Figure 9:
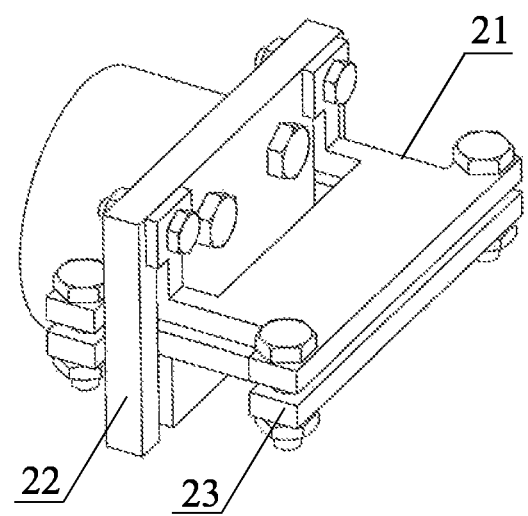
FIG. 9 is a structural diagram of the piezoelectric beam clamp structure, according to one embodiment.
Figure 11:
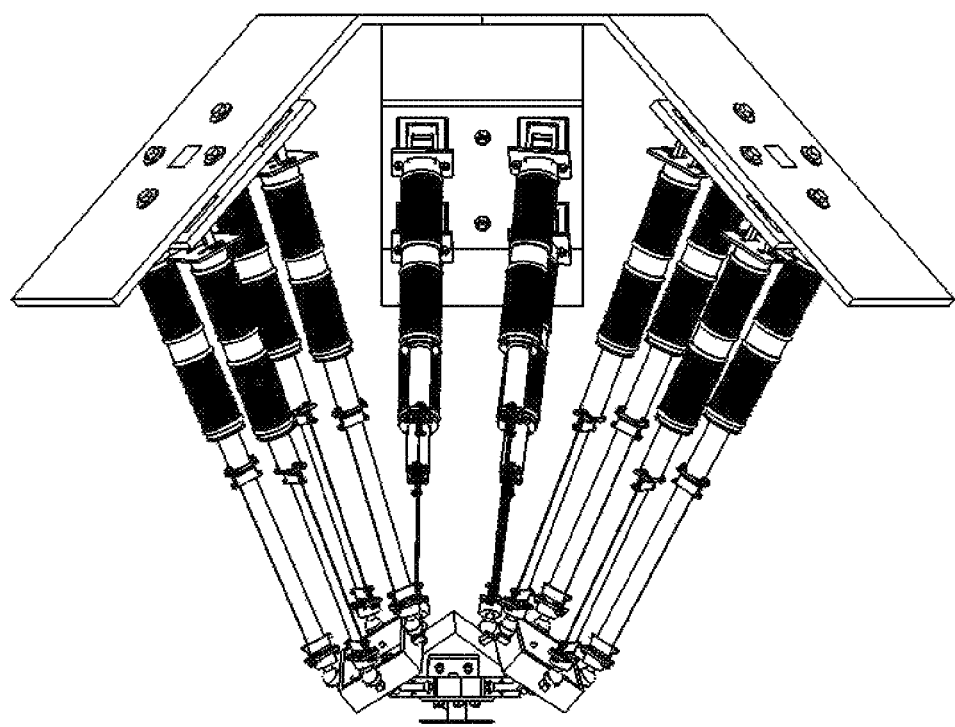
FIG. 11 is the elevation diagram of a piezoelectric electromagnetic combined energy harvester based on parallel mechanism, according to one embodiment.
Figure 12:
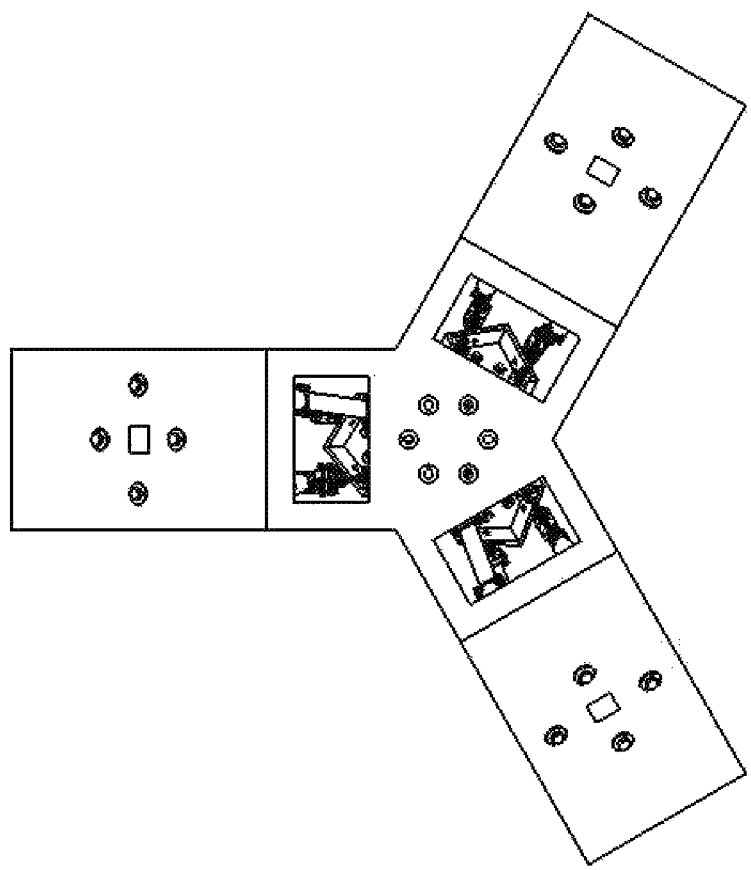
FIG. 12 is the top view of a piezoelectric electromagnetic combined energy harvester based on parallel mechanism, according to one embodiment.
Figure 13:
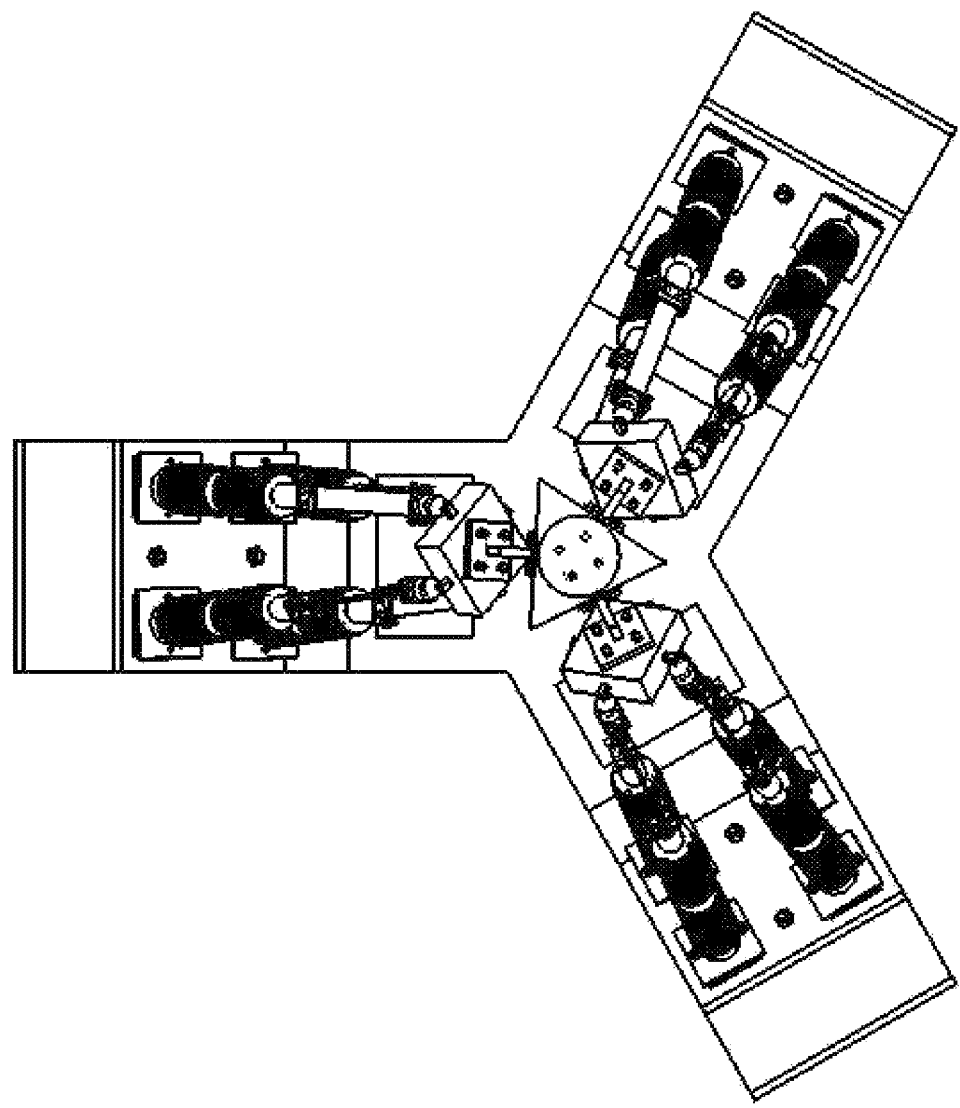
FIG. 13 is the bottom view of a piezoelectric electromagnetic combined energy harvester based on parallel mechanism, according to one embodiment.

As shown in FIG. 1-FIG. 13, a piezoelectric electromagnetic combined energy harvester based on parallel mechanism is disclosed. The harvester includes the fixed bracket 1, three groups of motion branches and a movable bracket. The fixed bracket 1 is composed of three fixed branches, the angles of the adjacent two fixed branches are all 120°, so that the branches of parallel mechanism are evenly distributed, and central position of the fixed branch is provided with three square holes to reduce the weight of the fixed bracket 1. The central position of the fixed bracket 1 has six bolt holes. The fixed bracket 1 fixes with the external platform through bolt connection. Each group of motion branches has the same structure that includes a fixed platform 2, four telescopic motion components and a motion platform 8. The motion platform 8 further includes a bottom platform connector 25, a bottom platform 14 and a bottom platform support 9. The fixed platform 2 of the motion branch is connected with the fixed bracket 1 through bolts, and the movable bracket is connected with the three groups of motion branches through the bottom platform connector 25.

Each telescopic motion component is composed of a Hooke universal joint 10, a telescopic rod component, a piezoelectric beam component and a ball hinge 24. The Hooke universal joint 10 and the fixed platform 2 are connected by a Hooke bracket clamp 11. The Hooke universal joint 10 is installed on the joint of telescopic rod component by bolts, the telescopic rod component connects the piezoelectric beam component by bolts, the piezoelectric beam component and the ball hinge 24 are also connected by bolts.

The telescopic rod component comprises the upper connector 17, a sleeve 6, a sleeve end cover 16, a motion guide rod 4, a motion rod spring 15, a permanent magnet 19, a magnet upper end cover 18, a magnet bottom end cover 20 and a coil 3. The upper connector 17 on the telescopic rod connects the sleeve 6 by bolts, the outer wall of the sleeve 6 is wrapped with coil 3, the circular sleeve end cover 16 is installed on one end of the sleeve that is far away from upper connector 17. The motion guide rod 4 is extended into the sleeve 6 through a center hole of sleeve end cover 16, and the telescopic movement or reciprocating movement can be made in the sleeve 6. The top of the motion guide rod 4 fixes the permanent magnet 19 through the magnet upper end cover 18 and the magnet lower end cover 20; a motion rod spring 15 is installed between the magnet lower end cover 20 and the sleeve 6; another motion rod spring 15 is installed between magnet upper end cover 18 and the top of the sleeve 6 inner wall. The initial position of permanent magnet 19 is in the middle of sleeve 6. When the harvester is stimulated by external excitation, the motion guide rod 4 makes reciprocating telescopic motion along the inner wall of the sleeve 6. The motion rod spring 15 provides support and cushion to the motion rod 4, and the outer wall of the sleeve 6 is wound with copper enameled coil 3. The permanent magnet 19 reciprocates with the motion guide rod 4 on the inner wall of sleeve 6, the magnetic flux inside the closed coil changes constantly, which generates induced electromotive force. Through holes are opened on the outer wall of the sleeve 6 to make the changes of the coil magnetic flux more pronounced to obtain better power generation effect.

The piezoelectric beam component comprises two piezoelectric beam clamp 7 and a PVDF piezoelectric beam 5. The piezoelectric beam clamp 7 can clamp piezoelectric beams with different thickness. The piezoelectric beam clamp 7 comprises a fixed base 22, a fixed splint 21 and a movable splint 23. The fixed base 22 and the motion guide rod 4 are connected by bolts; the fixed base 22 and the fixed splint 21 are fixed by bolts; the movable splint 23 slides on the fixed base 22 through the slide groove of the fixed base 22, thus adjusting the distance between the fixed splint 21 and the movable splint 23. The PVDF piezoelectric beam 5 is clamped between the fixed splint 21 and the movable splint 23. The fixed splint 21, the movable splint 23 and the PVDF piezoelectric beam 5 are clamped and fixed by bolts. The piezoelectric beam includes a protective layer, a piezoelectric layer and a base layer; the protective layer is glued on the piezoelectric layer through conductive adhesive; the piezoelectric layer is glued on the base layer through conductive adhesive. The protective layer material is polyester, the piezoelectric layer material is polarized PVDF, which has efficient power generation capacity, good flexibility, resistance to breakage, the base layer material is one of carbon fiber, steel or aluminum alloy. When the system is excited by the external environment, the telescopic rod component makes reciprocating movement. Since the internal part of telescopic rod component has the motion rod spring 15 to provide cushion and support, the cushioning force is transferred to the PVDF piezoelectric beam 5 through the motion guide rod 4. Since the PVDF piezoelectric beam 5 is flexible, it continuously bends and deforms, which leads to the polarization of the piezoelectric material in the PVDF piezoelectric beam 5 to generate electricity.

The ball hinge 24 connects piezoelectric beam component through bolts, and connects the motion platform 8 through bolts. Twelve PVDF piezoelectric beams and twenty-four induction coils are connected by wires to a functionable circuit capable of conducting electricity.

The movable support comprises a bottom platform 14, a bottom platform support frame 9 and a bottom platform connector 25. The bottom platform 14 and the motion platform 8 are connected by bolts through the bottom platform connector 25. The bottom platform support frame 9 and the bottom platform 14 are connected by bolts.

In conclusion, the invention disclosed a piezoelectric electromagnetic combined energy harvester based on parallel mechanism, which can perform multi-directional vibration and more comprehensively collect the vibration mechanical energy in each and multiple direction in the environment, and convert the mechanical energy into electrical energy. The structure can be used in mechanical product that has two components engaged in relative motion, such as a field robot deployed in the field. Because the robot has a complex multi-degree of freedom structure, the device disclosed in the invention can be integrated between two relatively-moving platforms to make the robot use the mechanical energy generated from the environment to generate electricity in field work, thus solving the problem of insufficient battery energy storage. The invention uses parallel mechanism to introduce twelve piezoelectric beams, twelve permanent magnets and twenty-four coils in a compact working space. The limited working space is fully utilized, and the combined working mode of piezoelectric energy collection technology and electromagnetic energy collection technology is adopted to make the overall power generation effect better, improve the power generation, and broaden the effective working bandwidth. Compared with single piezoelectric beam power generation structure, array piezoelectric beam power generation structure, or single electromagnetic induction power generation structure, the disclosed system has significant improvement in electric power generating capacity.

What is claimed is:
1. A piezoelectric electromagnetic combined energy harvester based on parallel mechanism, comprising:
   a fixed bracket (1), further comprising:
   three fixed branches, wherein any two adjacent fixed branches are connected at 120° angel, configured to achieve even distribution of branches of a parallel mechanism;
   a square hole located one each of the fixed branch to reduce weight; and
   six bolt holes located in the center of the fixed bracket (1), configured to fixedly connecting with an external platform through bolt connection;

three groups of motion branches of identical structure, each motion branch comprising:
  a fixed platform (2); further comprising:
    four telescopic motion components; and
    a motion platform (8); and
  a movable bracket; further comprising:
    a bottom platform connector (25);
    a bottom platform (14); and
    a bottom platform support frame (9);
  wherein the fixed platform (2) of the motion branch is connected with the fixed bracket (1) through bolts; and wherein the movable bracket is connected with the three groups of the motion branches through the bottom platform connector (25);
    each of the four telescopic motion components further comprises:
      a Hooke universal joint (10);
      a telescopic rod component; further comprising a telescopic rod component upper connector (17), a sleeve (6), a sleeve end cover (16), a motion guide rod (4), a motion rod spring (15), a permanent magnet (19), a magnet upper end cover (18), a magnet bottom end cover (20) and a coil (3);
      a piezoelectric beam component; and
      a ball hinge (24);
      wherein the Hooke universal joint (10) and the fixed platform (2) are connected by a Hooke bracket clamp (11), the Hooke universal joint (10) is installed on a joint of the telescopic rod component upper connector (17) by bolts, the telescopic rod component is connected to the piezoelectric beam component by bolts, and the piezoelectric beam component and the ball hinge (24) are connected by bolts;
  wherein the telescopic rod component upper connector (17) connects the sleeve (6) by bolts, the outer wall of the sleeve (6) is wrapped with the coil (3), the sleeve end cover (16) is annular and is configured to be installed on the end of the sleeve far away from the upper connector (17); the motion guide rod (4) is extended into the sleeve (6) through a center hole on the sleeve end cover (16), and is configured to perform telescopic movement within sleeve (6); the top of the motion guide rod (4) fixes the permanent magnet (19) between the magnet upper end cover (18) and the magnet lower end cover (20); the motion rod spring (15) is installed between the magnet lower end cover (20) and the sleeve (6); another motion rod spring (15) is installed between magnet upper end cover (18) and the top of the sleeve (6) inner wall; the initial position of the permanent magnet (19) is in the middle of the sleeve (6); when the harvester is stimulated by external excitation, the motion guide rod (4) is configured to make reciprocating telescopic motion along the inner wall of the sleeve (6); the motion rod spring (15) is configured to provide support and cushion to the motion rod (4), and the outer wall of the sleeve (6) is wound with the copper enameled coil (3); the permanent magnet (19) is configured to make reciprocating movement following the motion guide rod (4) on the inner wall of the sleeve (6), resulting in constantly changing magnetic flux inside the closed coil changes that generates induced electromotive force;
  the piezoelectric beam component further comprises two piezoelectric beam clamps (7) and a piezoelectric beam (5);
    the piezoelectric beam clamp (7) further comprises a fixed base (22), a fixed splint (21) and a movable splint (23); wherein the fixed base (22) and the motion guide rod (4) are connected by bolts; the fixed base (22) and the fixed splint (21) are fixedly connected by bolts; the movable splint (23) is configured to slide on the fixed base (22) through a slide groove on the fixed base (22), thus adjusting the distance between the fixed splint (21) and the movable splint (23);
    the piezoelectric beam (5) further comprises a protective layer, a piezoelectric layer, and a base layer; wherein the piezoelectric beam (5) is clamped between fixed splint (21) and movable splint (23); the fixed splint (21), the movable splint (23) and the PVDF piezoelectric beam (5) are clamped and fixed by bolts; the protective layer is glued on the piezoelectric layer through conductive adhesive; the piezoelectric layer is glued on the base layer by conductive adhesive; wherein when the harvester is excited by external environment, the telescopic rod component is configured to make reciprocating movement; via the motion rod spring (15) within the telescopic rod component that provides cushion and support, a cushioning force is impacted to the PVDF piezoelectric beam (5) through the motion guide rod (4); the flexible PVDF piezoelectric beam (5) is configured to continuously bend and deform under the cushioning force resulting in the polarization of piezoelectric material to generate electricity;
  wherein the ball hinge (24) connects the piezoelectric beam component through bolts, and connects the motion platform (8) through bolts; wherein the bottom platform (14) and the motion platform (8) are connected by bolts through the bottom platform connector (25); the bottom platform support frame (9) is configured to connect to the bottom platform (14) by bolts and to transfer vibration excitation from external environment to the harvester for energy collection.

2. The piezoelectric electromagnetic combined energy harvester based on parallel mechanism according to claim 1, wherein the piezoelectric beam clamp (7) is configured to clamp piezoelectric beams of different thickness.

3. The piezoelectric electromagnetic combined energy harvester based on parallel mechanism according to claim 1, wherein the protective layer comprises polyester, the piezoelectric layer comprises polarized PVDF, and the base layer comprises one chosen from the group of carbon fiber, steel, and aluminum alloy.

* * * * *